United States Patent
Kaiser

[19]

[11] Patent Number: 6,158,609
[45] Date of Patent: Dec. 12, 2000

[54] HOUSING FOR DEVICE, PARTICULARLY SENSOR FOR MOTOR VEHICLE

[75] Inventor: Harry Kaiser, Markgroeningen, Germany

[73] Assignee: Robert Bosch GmbH, Stuttgart, Germany

[21] Appl. No.: 09/113,475

[22] Filed: Jul. 10, 1998

[30] Foreign Application Priority Data

Sep. 5, 1997 [DE] Germany .................. 197 38 803

[51] Int. Cl.$^7$ .................. B65D 25/24; H05K 5/00
[52] U.S. Cl. .................. 220/480; 16/2.1; 174/18; 174/63; 174/152 R; 220/3.9; 220/DIG. 4
[58] Field of Search .................. 220/3.6, 3.7, 3.9, 220/3.92, 476, 480, DIG. 4; 16/2.1–2.3; 174/18, 50, 51, 58, 63, 152 R; 267/63

[56] References Cited

U.S. PATENT DOCUMENTS

| | | | |
|---|---|---|---|
| 973,568 | 10/1910 | Russell | 16/2.1 |
| 1,738,037 | 12/1929 | Collins | 16/2.1 |
| 2,586,528 | 2/1952 | Gerson | 16/2.1 |
| 2,734,711 | 2/1956 | Shppen | 220/476 X |
| 3,698,703 | 10/1972 | Hipsher | 267/219 |
| 4,114,976 | 9/1978 | Selvin et al. | 439/736 |
| 4,266,661 | 5/1981 | Andersson | 198/822 |
| 4,398,647 | 8/1983 | Ackerman | 220/476 X |
| 4,562,317 | 12/1985 | Gerber et al. | 200/19.4 |
| 4,596,973 | 6/1986 | Form et al. | 336/96 |
| 5,182,696 | 1/1993 | Her | 361/679 |
| 5,335,642 | 8/1994 | Hancock et al. | 123/634 |
| 5,352,850 | 10/1994 | Norris | 174/51 |
| 5,497,756 | 3/1996 | Matthiesen et al. | 123/634 |
| 5,690,879 | 11/1997 | Lee | 264/237 |
| 5,801,330 | 9/1998 | Gademann et al. | 174/52.1 |

FOREIGN PATENT DOCUMENTS

| | | |
|---|---|---|
| 91 11 106 U | 2/1993 | Germany . |
| 42 11 615 C2 | 9/1994 | Germany . |
| 336474 | 4/1959 | Switzerland ............ 220/476 |
| 840464 | 7/1960 | United Kingdom ....... 220/3.7 |

*Primary Examiner*—Allan N. Shoap
*Assistant Examiner*—Joe Merek
*Attorney, Agent, or Firm*—Micahel J. Striker

[57] ABSTRACT

A housing for a device mountable on a mounting surface has a housing element provided with two mounting flanges each having a passage adapted to extend substantially perpendicularly to the mounting surface and formed to receive a mounting bolt, two bushings extending through the mounting flanges and surrounding the passages, the bushings being composed of metal and injection molded with a material of the housing element, each of the passages being formed as an elongated hole with a width adapted to correspond to a diameter of the bolts, the bushings corresponding to a contour of the passages and surrounding the passages with a radial distance therefrom, the bushings being provided with peripheral formations which are filled with the material of the housing element, and the bushings at an inner peripheral side being free from the material of the housing over a part of an axial length of the bushings and a lower side of the mounting flanges.

5 Claims, 1 Drawing Sheet

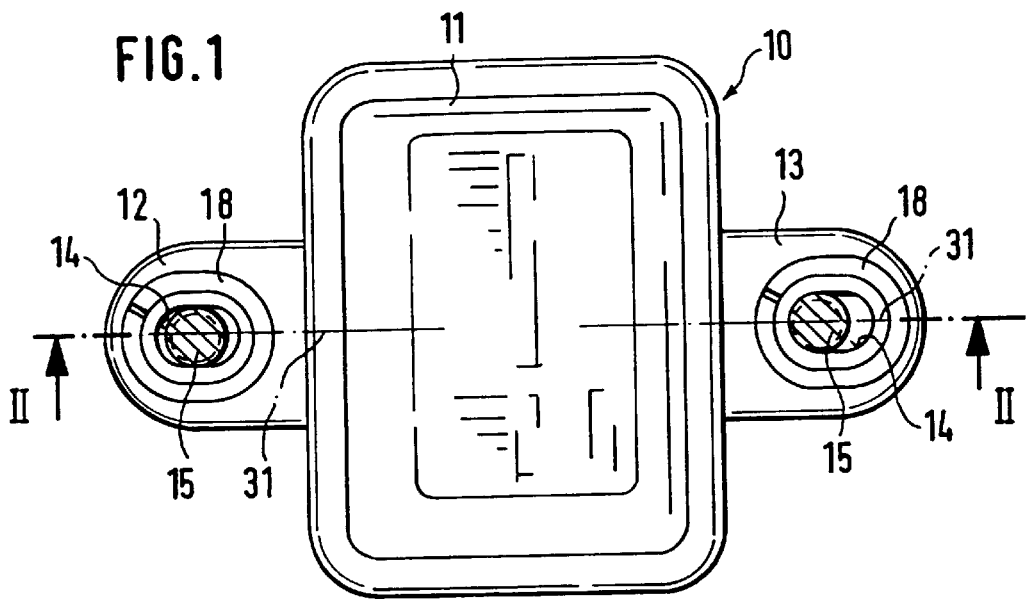
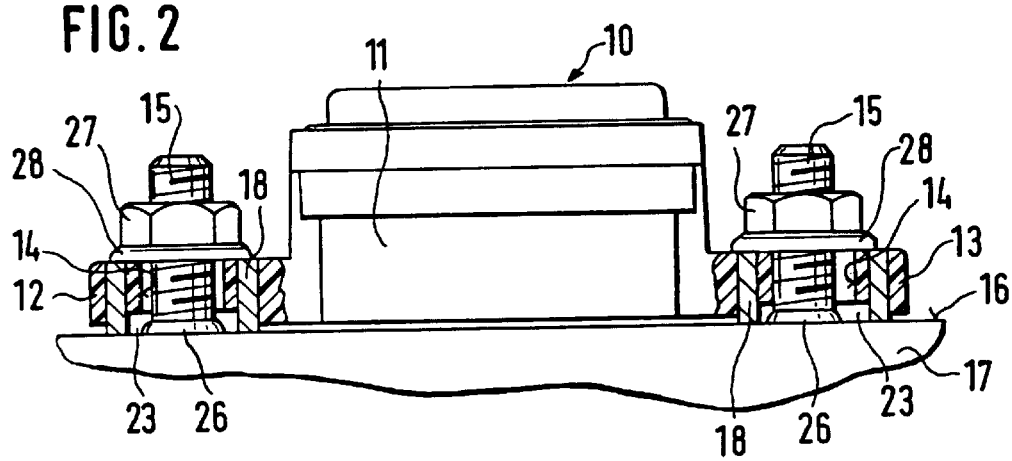
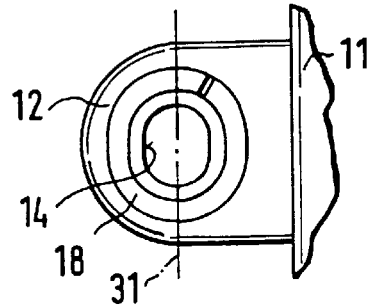
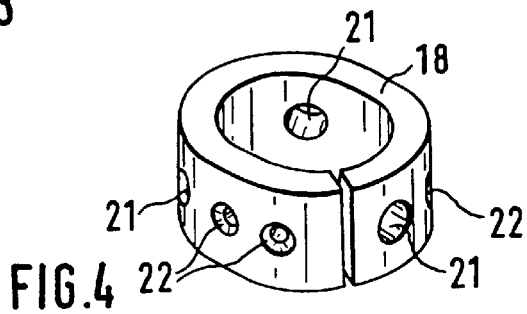

HOUSING FOR DEVICE, PARTICULARLY SENSOR FOR MOTOR VEHICLE

BACKGROUND OF THE INVENTION

The present invention relates to a housing for a device, and in particular for a sensor for a motor vehicle.

Device housings of the above mentioned general type are known in the art. One of such devices is disclosed for example in the German patent document DE 42 11 615 C2. In this housing the housing casing which is composed of sheet metal extends in the mounting flange and then is rolled to form bushings with circular cross-sections. The bushings are injection molded from the material of the housing which is composed of synthetic plastic. Mounting means which are received in the bushings, such as bolts and the like, must be arranged with small tolerances on a mounting surface for the device. Great tolerances between the mounting means and the bushings, to the contrary can lead to a relatively position-inaccurate mounting of the device on the mounting surface.

German document DE 91 11 106 U1 discloses a device in which two the passages provided in mounting flanges of a device housing for passing of mounting means are each formed as an elongated hole. It is therefore possible to compensate great distance tolerances of the mounting means.

It is desirable to further improve the device housings of the above mentioned general type.

SUMMARY OF THE INVENTION

Accordingly, it is an object of present invention to provide a housing for a device, in particular a sensor for motor vehicles, which avoids the disadvantages of the prior art.

In keeping with these objects and with others which will become apparent hereinafter, one feature of present invention resides, briefly stated, in a housing for a device mountable on a mounting surface, in particular a sensor for motor vehicles, in which the housing is provided with two mounting surfaces which have each a passage extending perpendicular to the mounting surface and provided for passing a bolt, the passages are located inside of the bushings extending through the mounting surface, the bushings are composed of metal and injection molded with the material of the housing, wherein in accordance with the new features of the present invention, both bushings are formed as elongated holes with a width and a diameter corresponding to the bolts, the bushings correspond to the contour of the passages and surround them with a radial distance, the bushings have at a peripheral side, depressions and/or throughgoing openings filled with the material of the housing, and the bushings at the inner peripheral side over a part of their axial length are free from the material of the housing opposite to the lower side of the mounting flange.

When the housing is designed in accordance with the present invention, it has the advantage that the device can be mounted on the mounting surface and the distance between the mounting means is subjected to great deviations. The device, transversely to the longitudinal axis of the elongated passages is supported in the corresponding mounting flange without gaps against the mounting means, so that at least in the transverse direction of the elongated hole, a position-accurate arrangement of the device is provided. The form-locking and dimension-accurate design of the elongated hole is produced in the corresponding mounting flange by injection tool of the housing, while the bushings take over the objective to transmit the clamping forces applied by a bolt head or a nut on the mounting means to the bushings, to the component which is provided with the mounting surface for the device.

The inner form-locking connection of the bushings with the housing material prevents loosening and guarantees the transmission of the forces acting on the device to the component. Since there is no lower side enveloping of the bushings, it is possible to receive for example a welding seam which is provided during the use of welding bolts or a collar on the bolts. This free space is produced by a correspondingly shaped core of the injection tool for the housing, and the core simultaneously serves for the position-fixing of the bushing during the injection process.

In accordance with another feature of the present invention, the bushings extend over the lower side of the mounting flange. This construction prevents a loading or deformation of the device housing by unevenness located in the mounting surface between the mounting points.

In accordance with still a further embodiment of the present invention, the bushings are formed by roll metal sheet strips. This substantially reduces the cost of the bushings when compared with a turned part.

A further feature of the present invention resides in that the bushings are identically axially oriented relative to the longitudinal axis of their contours. In this constructions the mounting of the device housing is possible with an specially great distance tolerances of the mounting means or with small distance deviations of the mounting means, by orientation of the device housing by a limited displacement in direction of the above mentioned axis.

Still a further feature of the present invention is that the bushings are offset relative to the longitudinal axis of their contours by 90° relative to one another. With this feature, it is possible to provide a limited turning of the device housing around the axis of the mounting means. Thereby a required orientation of the device relative to the component which has the mounting surface is adjusted, and subsequently the device is mounted.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 1 is a plan view showing a device in accordance with the present invention with two mounting flanges;

FIG. 2 is a side view of the device with the mounting flanges which are sectioned along the line II—II in FIG. 1;

FIG. 3 is a plan view of a mounting flange in accordance with another embodiment; and FIG. 4 is a spacial illustration of a bushing formed in the mounting flange, on enlarged scale.

DESCRIPTION OF PREFERRED EMBODIMENTS

A device, for example a sensor for motor vehicles is identified with reference numeral 10. It has a housing 11 which is composed of synthetic plastic and produced by injection molding. The housing 11 is provided with mounting flanges 12 and 13 formed on its sides which face away from one another. The mounting flanges are shown in FIGS. 1 and 2.

The mounting flanges and the lower side of the housing 11 are limited by a common plane. The passage 14 is formed in each of the mounting flanges 12 and 13 and shaped as a longitudinal hole. The passages 14 of the mounting flanges 12 and 13 are designed for receiving of mounting means. In the shown example, the mounting means are welding bolts 15. The welding bolts 15 extend perpendicularly from a mounting surface 16 of a component 17, for example a body part of a motor vehicle, with the axis which extends parallel. The passages 14 extend perpendicular to the mounting surface 16 and are located inside the bushings 18 which extend through the mounting flanges 12 and 13. The passages 14 are formed with a width corresponding to the diameter of the bolts 15 and a greater length. The bushings 18 surround the corresponding passages 14 with a uniform radial distance.

The bushing 18 which is shown on a perspective view in FIG. 4 is composed of metal. It is rolled from sheet metal strip to a shape corresponding to the passage 14 in the mounting flanges 12 and 13. The bushing 18 is provided with throughgoing openings 21 in its wall. Impressed depressions 22 are located between the throughgoing openings 21 and distributed over the periphery. In the shown example there are three throughgoing openings 21 and there are six depressions 22. The bushing 18 has a greater axial length than the height of the mounting flange 12 and 13. It can be clearly seen from FIG. 2, that the corresponding bushing 18 is flush with the upper surface of the mounting flange 12 and 13. However, it extends by a small distance over the lower side of the mounting flange 12 and 13.

A corresponding bushing 18 is thereby surrounded approximately over its whole axial length by the material of the housing 11 at the peripheral side. The housing material surrounds both bushings 18 of the mounting flanges 12 and 13 at the inner peripheral side over a substantial part of their axial length. A free space 23 is however provided between the lower side of each mounting flange 12 and 13.

The housing material located at the outer peripheral side and at the inner peripheral side penetrates through the throughgoing openings 21 of the bushings 18 and fills the depressions 22 at the outer periphery of the bushings. Thereby an intimate form-locking connection between the bushings and the mounting flanges 12 and 13 is provided.

The device 10 is supported however with the end side of the bushings 18 against the mounting surface 16 of the component 17. A small distance remains between the lower side of the housing 11 and the mounting flanges 12 and 13. The bolts 15 which are welded on the component 17 have a welding bead 26 which is received in the sufficiently great free space 27 inside the corresponding bushing 18. Hexagonal nuts 27 with a pressed-on flange 28 are screwed on the bolts 15 which extend with their outer diameter matchingly through the corresponding passage 14 in the mounting flanges 12 and 13. The hexagonal nuts 27 engage by their flange 28 with the freely located end side of the bushings 18. The clamping force of the screw connection is transmitted however from the bushings 18 to the component 17.

As can be seen from FIG. 1 the bushings 18 are oriented axially identically relative to the longitudinal axes of their contours. Also the passages 14 in both mounting flanges 12 and 13 of the housing 11 are also oriented identically axially. Thereby, despite great distance tolerances of the bolts 14, a mounting of the device 10 on the component 17 is possible, as can be recognized on the length of the bolt portion in the passages 14 of the mounting flanges 12 and 13. When the distance tolerances of the bolts 15 are not exhausted, it is possible to displace the device 10 within certain limits in direction of the longitudinal axis 31 in order to mount it on the component 17. With the selected dimensions of the bushings 18, in each tolerance position of the bolts 15 of the flange 28, the nut 27 engages approximately over the total end surface of the associated bushing.

FIG. 3 shows that during formation of the housing 11, the passage 14 and the bushing 18 are however oriented in the mounting flange 12 so that the longitudinal axis 31 on the mounting flange 12 is offset relative to the longitudinal axis of the mounting flange 13 by 90°. With such an orientation of the passage 14, it is possible to turn the device over a small distance around the bolt 15 of the mounting flange 13 and to mount the component 17.

It will be understood that each of the elements described above, or two or more together, may also find a useful application in other types of constructions differing from the types described above.

While the invention has been illustrated and described as embodied in housing for device, particularly sensor for motor vehicle, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

What is claimed is:

1. A housing for a device mountable on a mounting surface, comprising a housing element provided with two mounting flanges each having a passage adapted to extend substantially perpendicularly to the mounting surface and formed to receive a mounting bolt; two bushings extending through said mounting flanges and surrounding said passages, said bushings being composed of metal and injection molded with a material of said housing element, each of said passages being formed as an elongated hole with a width adapted to correspond to a diameter of the bolts, said bushings corresponding to a contour of said passages and surrounding said passages with a radial distance therefrom, said bushings being provided with peripheral formations which are filled with the material of said housing element, and a lower portion of said bushings at an inner peripheral side being free from the material of said housing over a part of an axial length of said bushings at a lower side of said mounting flanges, said bushings extend outwardly beyond said lower side of said mounting flanges, each of said bushings being formed as a single rolled sheet metal strip, said inner peripheral side of said bushings being coated with the material of the housing such that said lower portion is defined as an annular space at a bottom of said bushings.

2. A housing as defined in claim 1, wherein said formations of said bushings are formed as depressions.

3. A housing as defined in claim 1, wherein said formations of said bushings are formed as throughgoing openings.

4. A housing as defined in claim 1, wherein said bushings are oriented identically axially relative to a longitudinal axis of a contour of each of said bushings.

5. A housing as defined in claim 1, wherein said bushings are oppositely offset by 90° relative to a longitudinal axes of their contours.

* * * * *